US010103358B2

(12) United States Patent
Jiao et al.

(10) Patent No.: US 10,103,358 B2
(45) Date of Patent: Oct. 16, 2018

(54) OLED SUBSTRATE AND PRODUCING METHOD THEREOF, PANEL, AND DISPLAY APPARATUS

(71) Applicant: BOE Technology Group Co., Ltd., Beijing (CN)

(72) Inventors: Zhiqiang Jiao, Beijing (CN); Huai-Ting Shih, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 54 days.

(21) Appl. No.: 15/121,843

(22) PCT Filed: Jul. 15, 2015

(86) PCT No.: PCT/CN2015/084048

§ 371 (c)(1),
(2) Date: Aug. 26, 2016

(87) PCT Pub. No.: WO2016/145757

PCT Pub. Date: Sep. 22, 2016

(65) Prior Publication Data

US 2017/0018729 A1 Jan. 19, 2017

(30) Foreign Application Priority Data

Mar. 17, 2015 (CN) .......................... 2015 1 0115023

(51) Int. Cl.
*H01L 51/52* (2006.01)
*H01L 51/56* (2006.01)

(52) U.S. Cl.
CPC ........ *H01L 51/529* (2013.01); *H01L 51/5253* (2013.01); *H01L 51/56* (2013.01);
(Continued)

(58) Field of Classification Search
CPC ...... H01L 51/524; H01L 51/529; H01L 51/56
See application file for complete search history.

(56) References Cited

U.S. PATENT DOCUMENTS 8,093,078 B2 1/2012 Kuo et al.
8,384,113 B2 2/2013 Kuo et al.
(Continued)

FOREIGN PATENT DOCUMENTS

CN 101009362 A 8/2007
CN 101908532 A 12/2010
(Continued)

OTHER PUBLICATIONS

First Office Action, including Search Report, for Chinese Patent Application No. 201510115023.1, dated Feb. 6, 2017, 16 pages.
(Continued)

*Primary Examiner* — Douglas Menz
(74) *Attorney, Agent, or Firm* — Westman, Champlin & Koehler, P.A.

(57) ABSTRACT

This disclosure provides an OLED substrate and a producing method thereof, a panel, and a display apparatus, and pertains to the field of OLED products and production. The OLED substrate comprises an OLED device and an encapsulating layer, which are located on a first substrate, wherein the encapsulating layer encapsulates the OLED device, and wherein the OLED substrate further comprises a heat-dissipating layer which is provided above the OLED device. By adding a heat-dissipating layer and by means of the good thermal conductivity of the heat-dissipating layer, the heat generated when OLED devices are lit is rapidly dissipated, so as to prolong the service life of OLED devices, such that the service life of OLED panel and in turn the service life of display apparatus are prolonged.

16 Claims, 8 Drawing Sheets

32-3
31-3
4
2
1
A

(52) U.S. Cl.
CPC ...... *H01L 51/524* (2013.01); *H01L 2251/301* (2013.01); *H01L 2251/558* (2013.01)

(56) References Cited

U.S. PATENT DOCUMENTS

| | | | | |
|---|---|---|---|---|
| 2012/0261713 | A1* | 10/2012 | Koo | H01L 51/524 257/100 |
| 2012/0313499 | A1* | 12/2012 | Son | H01L 51/5246 313/46 |
| 2015/0024528 | A1 | 1/2015 | Kim et al. | |
| 2015/0295204 | A1 | 10/2015 | Schlenker et al. | |

FOREIGN PATENT DOCUMENTS

| | | | |
|---|---|---|---|
| CN | 102024710 | A | 4/2011 |
| CN | 103594639 | A | 2/2014 |
| CN | 104037337 | A | 9/2014 |
| CN | 104659074 | A | 5/2015 |
| WO | 2014/076132 | A1 | 5/2014 |

OTHER PUBLICATIONS

International Search Report and Written Opinion, including English translation of Box No. V, for International Application No. PCT/CN2015/084048, dated Dec. 31, 2015, 12 pages.

Second Office Action, including Search Report, for Chinese Patent Application No. 201510115023.1, dated Dec. 22, 2017, 15 pages.

* cited by examiner

OLED SUBSTRATE AND PRODUCING METHOD THEREOF, PANEL, AND DISPLAY APPARATUS

CROSS-REFERENCE TO RELATED APPLICATION

This Application is a Section 371 National Stage Application of International Application No. PCT/CN2015/084048, filed 15 Jul. 2015, which has not yet published, in Chinese, the contents of which are hereby incorporated by reference in their entirety.

TECHNICAL FIELD

This disclosure relates to the field of OLEDs, particularly to an OLED substrate and a producing method thereof, a panel, and a display apparatus.

BACKGROUND ART

OLED (organic light emitting diode) display apparatuses have become one of key development directions of new-generation flat display apparatuses and thus receive increasing attention, due to a series of excellent characteristics, such as self light emission, no need of backlight module, high contrast and definition, wide view angle, full solidification, applicability for flexible panels, good temperature characteristic, low energy consumption, fast response speed, low production cost, etc. An OLED panel is an important constituent in an OLED display apparatus, and the service life of the OLED panel determines the service life of the OLED display apparatus.

An existing OLED panel comprises: a first substrate, an OLED device, an encapsulating layer, and a second substrate, wherein the first substrate is used for supporting the OLED device and the encapsulating layer; the OLED device for emitting light is provided on the first substrate, and the encapsulating layer is provided on the first substrate and fully covers the OLED device, for preventing water from entering the OLED device; the second substrate is fixed on the encapsulating layer, for protecting the encapsulating layer and the OLED device. Here, the first substrate, the OLED device, and the encapsulating layer constitute an OLED substrate.

In the process of achieving this invention, the inventors have found that the following problems are at least present in the prior art.

In one hand, compared to liquid crystal display panels, OLED panels have relatively short service life, and it is found after studying that the heat generated when an OLED device is lit and works for a long time is the main cause leading to fast fading of the service life of OLED panels. On the other hand, as the OLED technology develops, the application fields of OLED devices have been wider and wider, and the requirements for application environments are more severe, such as high-brightness display, large-size display, etc. With respect to OLED devices, the higher the brightness is and the larger the size is, the larger the amount of heat generation of the OLED device itself will be, and excessive heat will cause the service life of the OLED device to be shortened. Therefore, how to absorb and dissipate the heat of the OLED device is still a technical challenge which the researchers in the art encounter.

SUMMARY

In order to solve the problem of heat dissipation of OLED devices in the prior art, the embodiments of this disclosure provide an OLED substrate and a producing method thereof, a panel, and a display apparatus. The technical solutions used are as follows.

In one aspect, there is provided an OLED substrate, comprising an OLED device and an encapsulating layer, which are located on a first substrate, wherein the encapsulating layer encapsulates the OLED device, and wherein the OLED substrate further comprises a heat-dissipating layer which is provided above the OLED device.

In this specification, “above the OLED device” refers to being located on a side of the OLED device opposite to the first substrate.

Optionally, the heat-dissipating layer is provided between the OLED device and the encapsulating layer.

Optionally, the heat-dissipating layer is in contact with the OLED device.

Optionally, the heat-dissipating layer, which is in contact with the OLED device, is an insulator heat-dissipating material or a semiconductor heat-dissipating material.

Optionally, the heat-dissipating layer is not in contact with the OLED device.

Optionally, the heat-dissipating layer, which is not in contact with the OLED device, is an insulator heat-dissipating material, a semiconductor heat-dissipating material, or a metal material.

Optionally, the encapsulating layer includes a plurality of layers, and the heat-dissipating layer is provided between any two adjacent layers of the plurality of encapsulating layers.

Optionally, the heat-dissipating layer, which is provided between any two adjacent layers of the plurality of encapsulating layers, is an insulator heat-dissipating material, a semiconductor heat-dissipating material, or a metal material.

Optionally, the heat-dissipating layer is provided outside the encapsulating layer.

Optionally, the heat-dissipating layer, which is provided outside the encapsulating layer, is an insulator heat-dissipating material, a semiconductor heat-dissipating material, or a metal material.

Optionally, the insulator heat-dissipating material is one of a nitride of aluminum, boron nitride, polycrystalline boron nitride, or aluminum oxide.

Optionally, the semiconductor heat-dissipating material is one of graphene or carbon nanotube.

Optionally, the metal material is one of aluminum, magnesium, or copper.

Optionally, the heat-dissipating layer has a thickness of 100 μm or less.

Optionally, the heat-dissipating layer has a thickness of 1 μm-5 μm.

Optionally, the encapsulating layer is a thin-film encapsulating layer.

In another aspect, there is provided a producing method of an OLED substrate, and the producing method comprises the steps of:

providing a first substrate;

preparing an OLED device on the first substrate; and performing the preparation of an OLED substrate on the OLED device, wherein the OLED substrate comprises a heat-dissipating layer and an encapsulating layer, and the heat-dissipating layer is provided above the OLED device.

Optionally, the heat-dissipating layer is provided between the OLED device and the encapsulating layer, said performing the preparation of an OLED substrate on the OLED device specifically comprises:

preparing the heat-dissipating layer on the OLED device; and preparing the encapsulating layer on the heat-dissipating layer.

Optionally, the encapsulating layer includes a plurality of encapsulating layers, the heat-dissipating layer is provided between two adjacent encapsulating layers, and said performing the preparation of an OLED substrate on the OLED device specifically comprises:

preparing an encapsulating layer on the OLED device;

preparing the heat-dissipating layer on the encapsulating layer; and further preparing an encapsulating layer on the heat-dissipating layer.

Optionally, the heat-dissipating layer is provided outside the encapsulating layer, and said performing the preparation of an OLED substrate on the OLED device specifically comprises:

preparing the encapsulating layer on the OLED device; and preparing the heat-dissipating layer on the encapsulating layer.

In another aspect, there is provided an OLED panel, comprising the OLED substrate as described above and a second substrate oppositely mounted on the OLED substrate.

In another aspect, there is provided a display apparatus, comprising the OLED substrate as described above.

The advantageous effects brought about by the technical solutions provided by embodiments of this disclosure are as follows.

By adding a structure of a heat-dissipating layer and by means of the good thermal conductivity of the heat-dissipating layer, the present disclosure provides a OLED substrate and a producing method thereof, a panel, and a display apparatus, in which the heat generated when OLED devices are lit is rapidly dissipated, so as to prolong the service life of OLED devices, such that the service life of OLED panels and in turn the service life of display apparatuses are prolonged, and the producing method further has the advantage that the process is simple and easy to be achieved.

BRIEF DESCRIPTION OF THE DRAWINGS

In order to illustrate the technical solutions in embodiments of this disclosure more clearly, the figures required for describing the embodiments will be simply introduced below. It is apparent that the figures described below are merely some embodiments of this disclosure, and other figures may be further obtained by ordinary skilled person in the art according to these figures without exerting inventive work.

Each of the symbols in the figures represents the meanings as follows:

1 first substrate,

2 OLED device,

3 encapsulating layer, 31 first encapsulating layer, 32 second encapsulating layer,

4 heat-dissipating layer,

5 second substrate,

6 encapsulating sheet adhesive,

A. OLED substrate,

I. OLED panel.

DESCRIPTION OF EMBODIMENTS

In order to enable objects, technical solutions, and advantages of this disclosure to be more clear, embodiments of this disclosure will be further described in details in conjunction with accompanying drawings.

Embodiment 1

Figure 1:
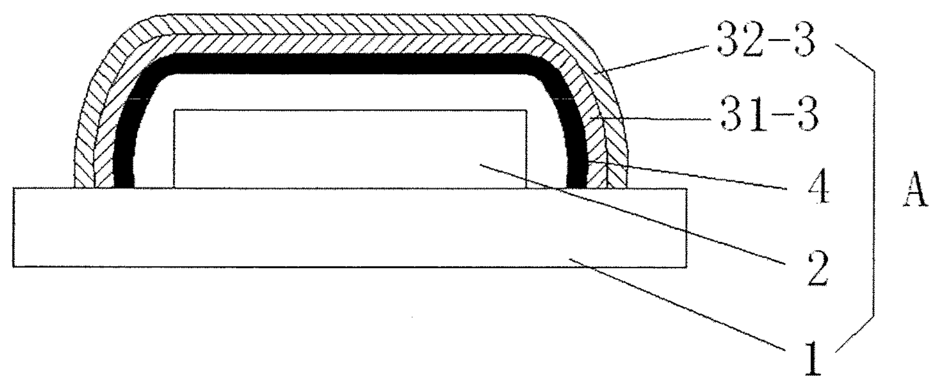
FIG. 1 is a structural diagram of one OLED substrate provided by an embodiment of this disclosure.

As shown in FIG. 1, this embodiment provides an OLED substrate A, comprising an OLED device 2 and an encapsulating layer 3, which are located on a first substrate 1, wherein the encapsulating layer 3 encapsulates the OLED device 2, and wherein the OLED substrate A further comprises a heat-dissipating layer 4 provided above the OLED device 2, and the heat-dissipating layer 4 is used for dissipating the heat generated by the OLED device 2.

The OLED substrate A of this embodiment adds a heat-dissipating layer 4, and by means of the good thermal conductivity of the heat-dissipating layer 4, it rapidly dissipates the heat generated when the OLED device 2 is lit, and the service life of the OLED device 2 is prolonged.

As shown in FIG. 1, in this embodiment, the heat-dissipating layer 4 is provided between the OLED device 2 and the encapsulating layer 3. This embodiment can effectively improve the condition of heat dissipation of the OLED substrate A.

Particularly, in this embodiment, the heat-dissipating layer 4 is not in contact with the OLED device 2, as shown in FIG. 1. In another preferred embodiment, the heat-dissipating layer 4 is in contact with the OLED device 2, and such contact structure is favorable to better heat dissipation.

More particularly, in this embodiment, the heat-dissipating layer 4 is one layer; the encapsulating layer 3 includes two layers which are a first encapsulating layer 31 and a second encapsulating layer 32; the heat-dissipating layer 4 is provided between the OLED device 2 and the first encapsulating layer 31; the heat-dissipating layer 4 fully covers the OLED device 2; the heat-dissipating layer 4, the first encapsulating layer 31, and the second encapsulating layer 32 are provided by lamination; and the heat-dissipating layer 4 is in contact with the first encapsulating layer 31. In this embodiment, by forming a contact-type heat dissipation structure with the heat-dissipating layer 4 and the encapsulating layer 3, it can be better for the heat dissipation of the OLED device 2.

In this embodiment, the heat-dissipating layer 4 is an insulator heat-dissipating material, a semiconductor heat-dissipating material, or a metal material. When the heat-dissipating layer 4 is not in contact with the OLED device 2, the heat-dissipating layer 4 may be formed of a variety of materials described above; and when the heat-dissipating layer 4 is in contact with the OLED device 2, an insulator heat-dissipating material or a semiconductor heat-dissipating material is used for the heat-dissipating layer 4. This embodiment can effectively improve the condition of heat dissipation of the OLED substrate A.

Here, the insulator heat-dissipating material includes a nitride of aluminum (AlNx), boron nitride (BN), polycrystalline boron nitride (PBN), aluminum oxide ($Al_2O_3$), etc. In this embodiment, a nitride of aluminum (AlNx) is preferred. Since a nitride of aluminum (AlNx) has good thermal conductivity, the heat-dissipating layer 4 produced from the nitride of aluminum (AlNx) will significantly improve the condition of heat dissipation of the OLED substrate A, so as to greatly prolong the service life of the OLED panel.

The semiconductor heat-dissipating material includes graphene, carbon nanotube, etc.

The metal material has good thermal conductivity and includes aluminum (Al), magnesium (Mg), copper (Cu), etc.

Of course, the person skilled in the art may understand that the heat-dissipating layer 4 may also be in contact with the first encapsulating layer 31. In this embodiment, the heat-dissipating layer 4 is an insulator heat-dissipating material, a semiconductor heat-dissipating material, or a metal heat-dissipating material. The condition of heat dissipation of the OLED substrate A can be effectively improved. Here, the insulator heat-dissipating material includes a nitride of aluminum (AlNx), boron nitride (BN), polycrystalline boron nitride (PBN), aluminum oxide ($Al_2O_3$), etc. In this embodiment, a nitride of aluminum (AlNx) is preferred. Since a nitride of aluminum (AlNx) has good thermal conductivity, the heat-dissipating layer 4 produced from the nitride of aluminum (AlNx) will significantly improve the condition of heat dissipation of the OLED substrate A so as to greatly prolong the service life of the OLED panel.

Of course, the person skilled in the art may understand that the heat-dissipating layer 4 may also include a plurality of layers, such as two layers, three layers, etc., wherein a plurality of heat-dissipating layers 4 are provided by lamination, and a plurality of heat-dissipating layers 4 may have the same or different materials. In a specific practice, the layer number and the material of the heat-dissipating layer 4 are selected according to the demand for heat dissipation. Additionally, the encapsulating layer may be a thin film encapsulating layer, or may also be an encapsulating layer in other forms.

Of course, the person skilled in the art may understand that the encapsulating layer 3 may be one layer, or the encapsulating layer 3 may also include a plurality of layers, such as three layers, four layers, etc., wherein a plurality of encapsulating layers 3 are provided by lamination, and a plurality of encapsulating layers 3 may have the same material or different materials. In a specific practice, the layer number and the material of the encapsulating layer 3 are selected according to the demand for insulation and water resistance.

Particularly, in this embodiment, the first encapsulating layer 31 and the second encapsulating layer 32 are different in materials, where the material of the first encapsulating layer 31 is a nitride of silicon (SiNx) and the material of the second encapsulating layer 32 is an oxide of silicon (SiOx). In this embodiment, it can be effective for the OLED device 2 to resist water.

Of course, the material of the first encapsulating layer 31 may also be an oxide of silicon (SiOx), and the material of the second encapsulating layer 32 may also be a nitride of silicon (SiNx). Or, each of the materials of the first encapsulating layer 31 and the second encapsulating layer 32 is an oxide of silicon (SiOx), or each of the materials of the first encapsulating layer 31 and the second encapsulating layer 32 is a nitride of silicon (SiNx). Of course, the first encapsulating layer 31 and second encapsulating layer 32 may also be other materials, as long as the performances of insulation and water resistance can be satisfied.

More particularly, in this embodiment, the OLED device 2 is a bottom-emission device.

Of course, the person skilled in the art may understand that the OLED device 2 may also be a top-emission device.

Figure 2:
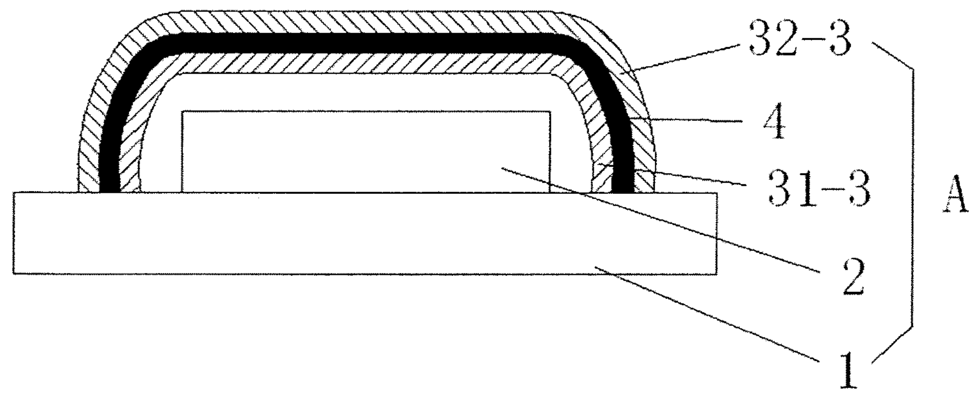
FIG. 2 is a structural diagram of another OLED substrate provided by an embodiment of this disclosure.

As shown in FIG. 2, in this embodiment, the encapsulating layer 3 includes a plurality of layers, and the heat-dissipating layer 4 is provided between any two adjacent layers of the plurality of encapsulating layers 3. This embodiment can effectively improve the condition of heat dissipation of the OLED substrate A.

More particularly, in this embodiment, the heat-dissipating layer 4 is one layer; the encapsulating layer 3 includes two layers which are a first encapsulating layer 31 and a second encapsulating layer 32; the first encapsulating layer 31 fully covers the OLED device 2; the heat-dissipating layer 4 is provided between the first encapsulating layer 31 and the second encapsulating layer 32; and the first encapsulating layer 31, the heat-dissipating layer 4, and the second encapsulating layer 32 are provided by lamination.

More particularly, in this embodiment, the heat-dissipating layer 4 fully covers the first encapsulating layer 31, and the distance of the edge of the heat-dissipating layer 4 from the edge of the first encapsulating layer 31 is from 0 μm to 5000 μm and is preferably in the range of 50 μm to 500 μm as for narrow-border panels.

In this embodiment, the heat-dissipating layer 4 is an insulator heat-dissipating material, a semiconductor heat-dissipating material, or a metal material. This embodiment can effectively improve the condition of heat dissipation of the OLED substrate A.

Of course, the person skilled in the art may understand that the heat-dissipating layer 4 may also include a plurality of layers, such as two layers, three layers, etc., wherein a plurality of heat-dissipating layers 4 are provided by lamination, and a plurality of heat-dissipating layers 4 may have the same or different materials. In a specific practice, the layer number and the material of the heat-dissipating layer 4 are selected according to the demand for heat dissipation. Additionally, the encapsulating layer may be a thin film encapsulating layer, or may also be an encapsulating layer in other forms.

Of course, the person skilled in the art may understand that the encapsulating layer 3 may also include a plurality of layers, such as three layers, four layers, etc., wherein a plurality of encapsulating layers 3 are provided by lamination, and a plurality of encapsulating layers 3 may have the same or different materials. In a specific practice, the number and material are determined according to the performances of insulation and water resistance of the thin-film heat-dissipating layer 4. Particularly, the plurality of encapsulating layers 3 include a first, a second, a third, . . . , and a $N^{th}$ encapsulating layer; the heat-dissipating layer 4 is provided between the first encapsulating layer 31 and the second encapsulating layer 32; the heat-dissipating layer 4 is provided between the second encapsulating layer 32 and the third encapsulating layer; . . . ; or the heat-dissipating layer 4 is provided between the $N-1^{th}$ encapsulating layer and the $N^{th}$ encapsulating layer. That is, the heat-dissipating layer 4 may be provided between any two adjacent layers of the plurality of encapsulating layers 3.

Particularly, in this embodiment, the first encapsulating layer 31 and the second encapsulating layer 32 are different in materials, and the material of the first encapsulating layer 31 is a nitride of silicon (SiNx) and the material of the second encapsulating layer 32 is an oxide of silicon (SiOx).

Of course, the material of the first encapsulating layer 31 may also be an oxide of silicon (SiOx), and the material of the second encapsulating layer 32 may also be a nitride of silicon (SiNx). Or, each of the materials of the first encapsulating layer 31 and the second encapsulating layer 32 is an oxide of silicon (SiOx), or each of the materials of the first encapsulating layer 31 and the second encapsulating layer 32 is a nitride of silicon (SiNx). Of course, first encapsulating layer 31 and second encapsulating layer 32 may also be other materials, as long as the performances of insulation and water resistance can be satisfied.

More particularly, in this embodiment, the OLED device 2 is a bottom-emission device.

Of course, the person skilled in the art may understand that the OLED device 2 may also be a top-emission device.

Figure 3:
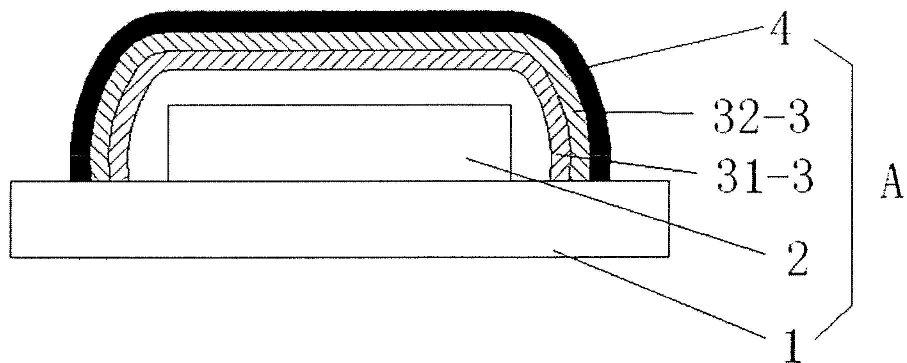
FIG. 3 is a structural diagram of another OLED substrate provided by an embodiment of this disclosure.

As shown in FIG. 3, in this embodiment, the heat-dissipating layer 4 is laminated outside the encapsulating layer 3. This embodiment can effectively improve the condition of heat dissipation of the OLED substrate A.

More particularly, in this embodiment, the heat-dissipating layer 4 is one layer; the encapsulating layer 3 includes two layers which are a first encapsulating layer 31 and a second encapsulating layer 32; the first encapsulating layer 31 fully covers the OLED device 2; the second encapsulating layer 32 is laminated on the first encapsulating layer 31; and the heat-dissipating layer 4 is superimposed and overlaid on the second encapsulating layer 32.

More particularly, in this embodiment, the distance of the edge of the heat-dissipating layer 4 from the edge of the second encapsulating layer 32 is from 0 μm to 5000 μm, and is preferably in the range of 50 μm to 500 μm for narrow-border panels.

In this embodiment, the heat-dissipating layer 4 is an insulator heat-dissipating material, a semiconductor heat-dissipating material, or a metal material. This embodiment can effectively improve the condition of heat dissipation of the OLED substrate A.

Of course, the person skilled in the art may understand that the heat-dissipating layer 4 may also include a plurality of layers, such as two layers, three layers, etc., wherein a plurality of heat-dissipating layers 4 are provided by lamination, and a plurality of heat-dissipating layers 4 have the same or different materials. In a specific practice, the layer number and the material of the heat-dissipating layer 4 are selected according to the demand for heat dissipation. Additionally, the encapsulating layer may be a thin film encapsulating layer, or may also be an encapsulating layer in other forms.

Of course, the person skilled in the art may understand that the encapsulating layer 3 may also include a plurality of layers, such as three layers, four layers, etc., wherein a plurality of encapsulating layers 3 are provided by lamination, and a plurality of encapsulating layers 3 have the same or different materials. In a specific practice, the number and material are determined according to the performances of insulation and water resistance of the thin-film heat-dissipating layer 4. Particularly, the plurality of encapsulating layers 3 include a first, a second, a third, . . . , and a $N^{th}$ encapsulating layer; the first encapsulating layer 31 to the $N^{th}$ encapsulating layer are provided by lamination from inside to outside; and the heat-dissipating layer 4 is provided outside the $N^{th}$ encapsulating layer.

Particularly, in this embodiment, the first encapsulating layer 31 and the second encapsulating layer 32 are different in materials, and the material of the first encapsulating layer 31 is a nitride of silicon (SiNx) and the material of the second encapsulating layer 32 is an oxide of silicon (SiOx).

Of course, the material of the first encapsulating layer 31 may also be an oxide of silicon (SiOx), and the material of the second encapsulating layer 32 may also be a nitride of silicon (SiNx). Or, each of the materials of the first encapsulating layer 31 and the second encapsulating layer 32 is an oxide of silicon (SiOx), or each of the materials of the first encapsulating layer 31 and the second encapsulating layer 32 is a nitride of silicon (SiNx). Of course, first encapsulating layer 31 and second encapsulating layer 32 may also be other materials, as long as the performances of insulation and water resistance can be satisfied.

More particularly, in this embodiment, the OLED device 2 is a bottom-emission device.

Of course, the person skilled in the art may understand that the OLED device 2 may also be a top-emission device.

As shown in FIG. 1, in this embodiment, the heat-dissipating layer 4 has a thickness of 100 μm or less. This embodiment can effectively improve the condition of heat dissipation of the OLED substrate A.

More preferably, the heat-dissipating layer 4 has a thickness of 1 μm-5 μm. This embodiment effectively improves the condition of heat dissipation of the OLED substrate A in the case that the materials are the most saved.

Of course, the person skilled in the art may understand that the thickness of the heat-dissipating layer 4 may also be applied in the embodiments as shown in FIG. 2 to FIG. 3.

More particularly, as shown in FIG. 1, in this embodiment, the first substrate 1 may be a glass substrate, and may also be a plastic substrate or other substrates. Of course, the first substrate 1 may also be a TFT substrate. Of course, the person skilled in the art may understand that in the embodiments as shown in FIG. 2 to FIG. 3, the first substrate 1 may be a glass substrate, and may also be a plastic substrate or other substrates. Of course, the first substrate 1 may also be a TFT substrate, wherein the TFT is used for controlling the on/off of the OLED device 2.

More particularly, as shown in FIG. 1, in this embodiment, the OLED device 2 may be a monochromatic, multichromatic, or white light-emitting device. Of course, the person skilled in the art may understand that in the embodiments as shown in FIG. 2 to FIG. 3, the OLED device 2 may be a monochromatic, multichromatic, or white light-emitting device.

Embodiment 2

Figure 4:
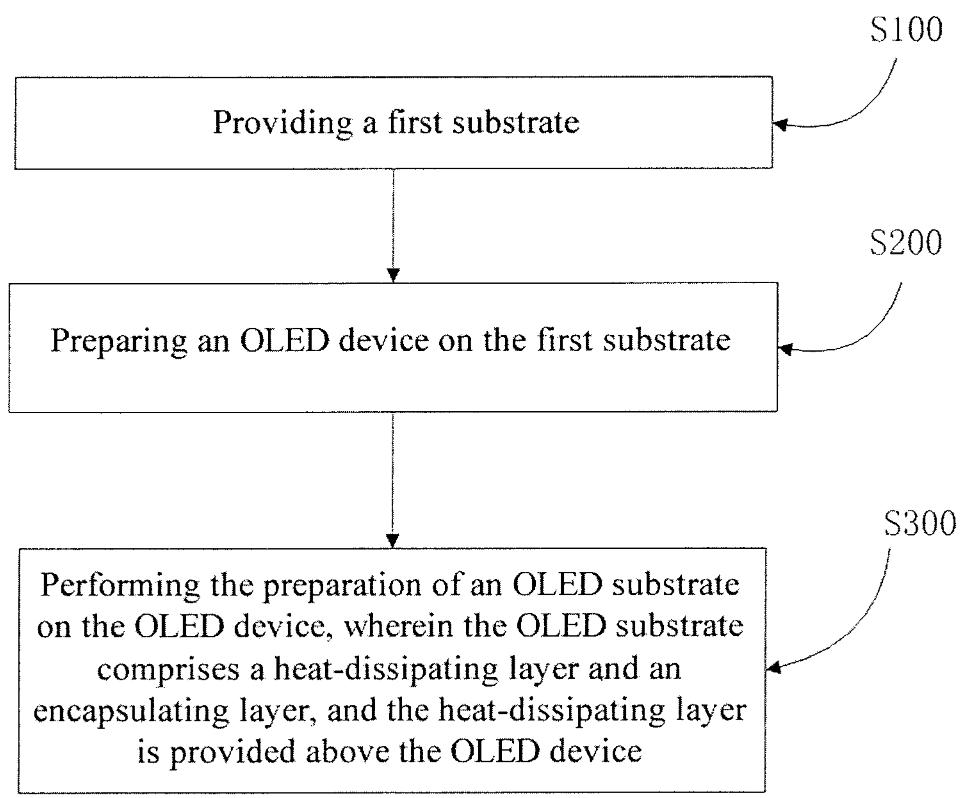
FIG. 4 is a flow chart of one producing method of an OLED substrate provided by an embodiment of this disclosure.
Figure 5:
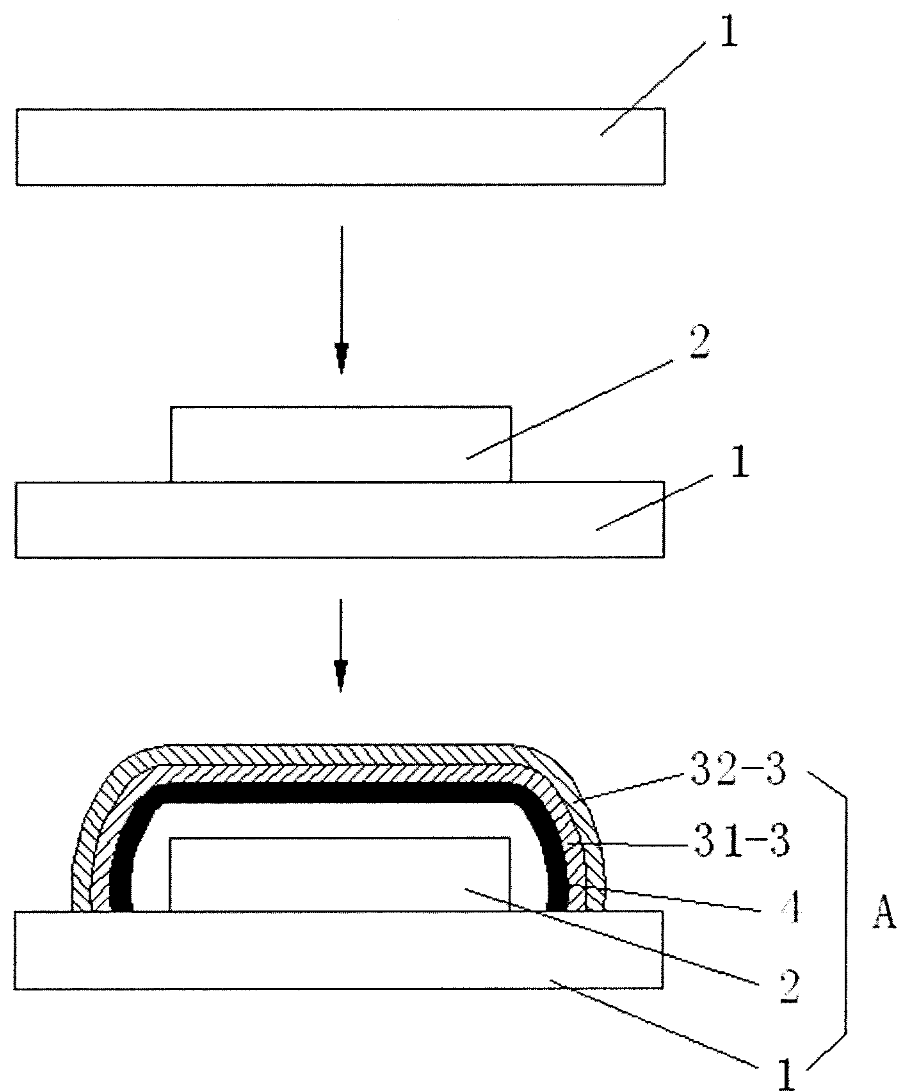
FIG. 5 is a structural diagram of one production process of an OLED substrate provided by an embodiment of this disclosure.

As shown in FIG. 4 and also with reference to FIG. 5 (this embodiment is illustrated by mainly using FIG. 4), the embodiment provides a producing method applied to the OLED substrate A, and the producing method comprises the steps of:

Step S100: providing a first substrate 1 (see FIG. 5);

Step S200: preparing an OLED device 2 (see FIG. 5) on the first substrate 1 (see FIG. 5); and Step S300: performing the preparation of an OLED substrate A (see FIG. 5) on the OLED device 2 (see FIG. 5), wherein the OLED substrate A (see FIG. 5) comprises a heat-dissipating layer 4 (see FIG. 5) and an encapsulating layer 3 (see FIG. 5), and the heat-dissipating layer is provided above the OLED device.

With reference to FIG. 5, Step S200 of preparing an OLED device 2 on the first substrate 1 is the same as a corresponding conventional process. In this embodiment, the preparation of the OLED device 2 is performed by an evaporation process on the basis that the first substrate 1 is prepared.

The structure of the OLED substrate A in this embodiment is completely the same as that of the OLED substrate A in embodiment 1, verbose words are omitted in this embodiment with respect to the part of the OLED panel substrate A.

With reference to FIG. 5, since the producing method of this embodiment includes all contents of the OLED substrate A in embodiment 1, the producing method of this embodiment also includes all effects of the OLED substrate A. By adding the heat-dissipating layer 4 and by means of the good thermal conductivity of the heat-dissipating layer 4, it rapidly dissipates the heat generated when the OLED device 2 is lit, so as to prolong the service life of the OLED device 2, such that the service life of OLED substrate A is prolonged, and the producing method further has the advantage that the process is simple and easy to be achieved.

Figure 6:
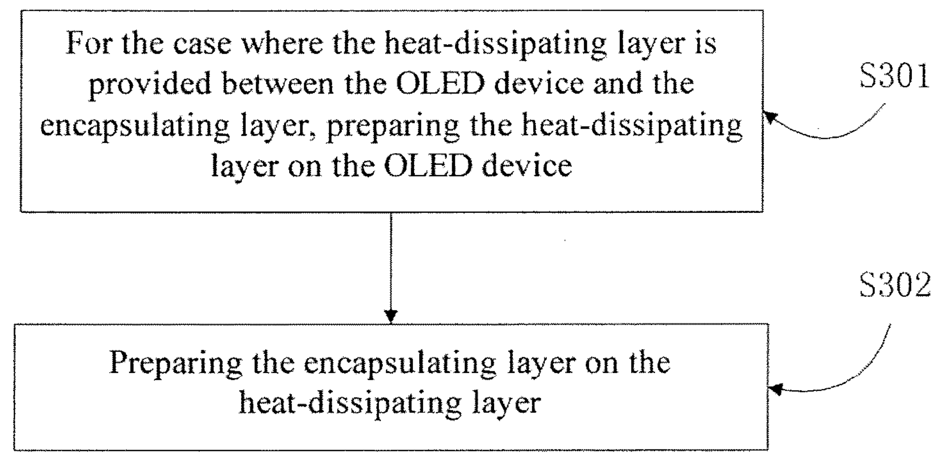
FIG. 6 is a flow chart of one producing method of an OLED substrate provided by an embodiment of this disclosure.
Figure 7:
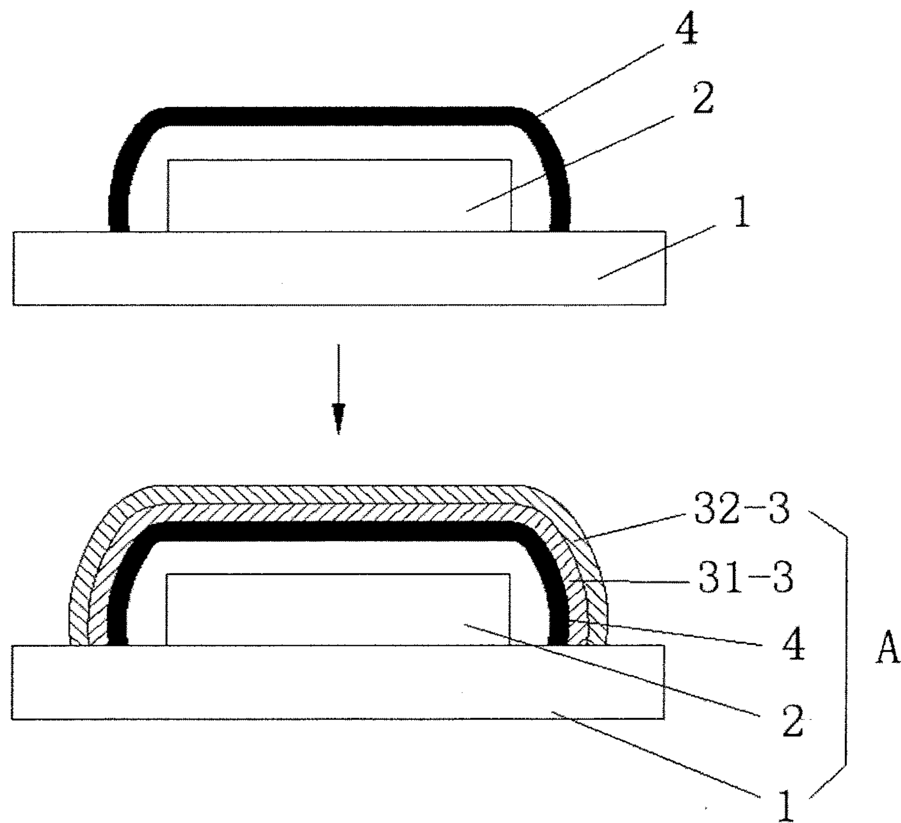
FIG. 7 is a structural diagram of one production process of an OLED substrate provided by an embodiment of this disclosure.

As shown in FIG. 6 and also with reference to FIG. 7 (this embodiment is illustrated by exemplifying FIG. 6), the heat-dissipating layer 4 (see FIG. 7) is provided between the OLED device 2 (see FIG. 7) and the encapsulating layer 3 (see FIG. 7), and performing the preparation of an OLED substrate A (see FIG. 7) on the OLED device 2 (see FIG. 7), which corresponds to the Step S300 in FIG. 4, specifically comprises:

Step S301: preparing the heat-dissipating layer 4 (see FIG. 7) on the OLED device 2 (see FIG. 7); and Step S302: preparing the encapsulating layer 3 (see FIG. 7) on the heat-dissipating layer 4 (see FIG. 7).

This embodiment has a simple process and is easy to be processed.

With reference to FIG. 7, particularly in this embodiment, the Step S301 is a step of preparing the heat-dissipating layer 4 on the OLED device 2, in particular the cathode of the OLED device 2, by a chemical vapor deposition (CVD) process, an in vacuo film forming (ALD) process, or a sputtering (SPUTTER) process. More particularly, when a nitride of aluminum is selected as the heat-dissipating layer 4, it is prepared by a chemical vapor deposition (CVD) process, and the thickness of the heat-dissipating layer 4 is preferably 2 micrometers. When aluminum oxide is used as the heat-dissipating layer 4, it is prepared by an in vacuo film forming (ALD) process, and the thickness of the heat-dissipating layer 4 is preferably 2 micrometers. The heat-dissipating layer 4 and the OLED device 2 may be in contact and may also be not in contact.

With reference to FIG. 7, particularly in this embodiment, the Step S302 is a step of preparing the encapsulating layer 3 on the heat-dissipating layer 4, by a chemical vapor deposition (CVD) process, an in vacuo film forming (ALD) process, or a sputtering (SPUTTER) process. More particularly, this embodiment comprises preparing a first encapsulating layer 31 (i.e., a layer of a nitride of silicon (SiNx)) with a thickness of preferably 2 micrometers on the heat-dissipating layer 4, by a chemical vapor deposition (CVD) process, an in vacuo film forming (ALD) process, or a sputtering (SPUTTER) process, and then preparing a second encapsulating layer 32 (i.e., a layer of an oxide of silicon (SiOx)) with a thickness of preferably 1.5 micrometers on first encapsulating layer 31, by a chemical vapor deposition (CVD) process, an in vacuo film forming (ALD) process, or a sputtering (SPUTTER) process. Accordingly, surface encapsulating is particularly performed on the second encapsulating layer 32.

Figure 8:
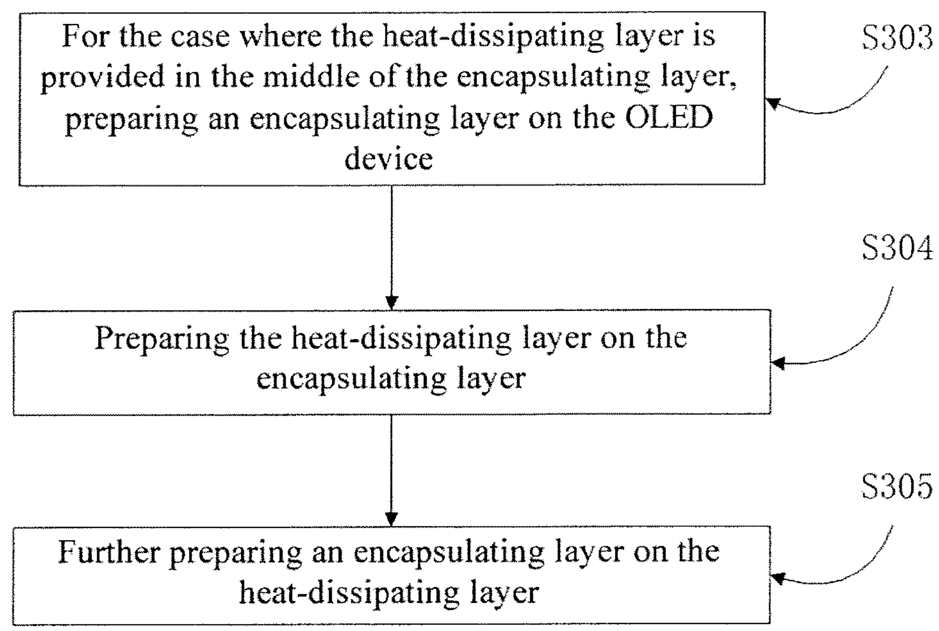
FIG. 8 is a flow chart of another producing method of an OLED substrate provided by an embodiment of this disclosure.
Figure 9:
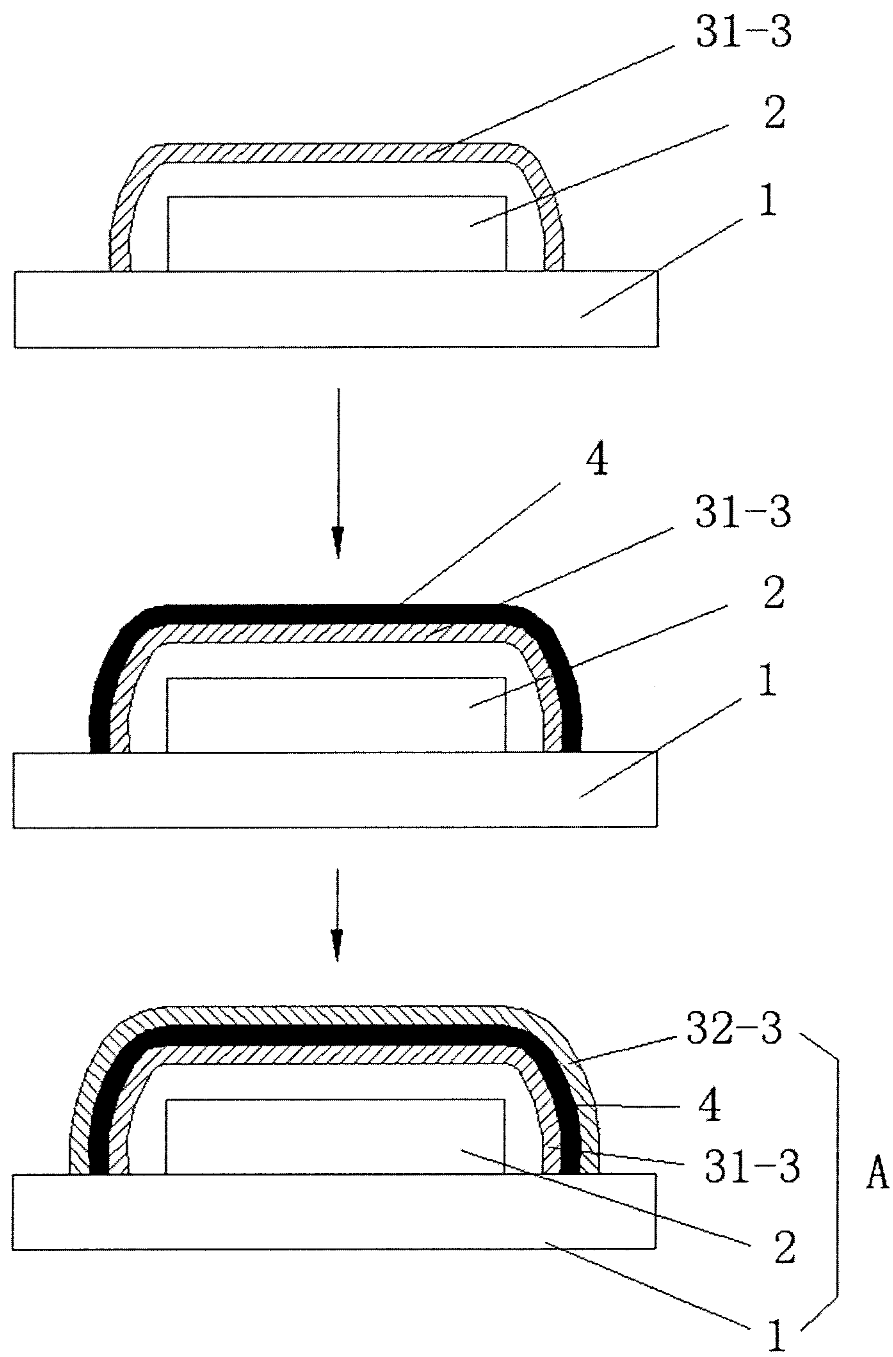
FIG. 9 is a structural diagram of another production process of an OLED substrate provided by an embodiment of this disclosure.

As shown in FIG. 8 and also with reference to FIG. 9 (this embodiment is illustrated by exemplifying FIG. 8), the heat-dissipating layer 4 (see FIG. 9) is provided in the middle of the encapsulating layer 3 (see FIG. 9), and performing the preparation of an OLED substrate A (see FIG. 9) on the OLED device 2 (see FIG. 9), which corresponds to the Step S300 in FIG. 4, specifically comprises:

Step S303: preparing an encapsulating layer 3 (see FIG. 9) on the OLED device 2 (see FIG. 9);

Step S304: preparing the heat-dissipating layer 4 (see FIG. 9) on the encapsulating layer 3 (see FIG. 9); and Step S305: further preparing an encapsulating layer 3 (see FIG. 9) on the heat-dissipating layer 4 (see FIG. 9).

This embodiment has a simple process and is easy to be processed.

With reference to FIG. 9, particularly in this embodiment, the Step S303 is a step of preparing a first encapsulating layer 31 (i.e., a nitride of silicon (SiNx)) with a thickness of preferably 1.5 micrometers on the OLED device 2, in particular a cathode of the OLED device 2, by a chemical vapor deposition (CVD) process, an in vacuo film forming (ALD) process, or a sputtering (SPUTTER) process.

With reference to FIG. 9, particularly in this embodiment, the Step S304 is a step of preparing the heat-dissipating layer 4 on the first encapsulating layer 31, by a chemical vapor deposition (CVD) process, an in vacuo film forming (ALD) process, or a sputtering (SPUTTER) process. More particularly, when a nitride of aluminum is selected as the heat-dissipating layer 4, it is prepared by a chemical vapor deposition (CVD) process, and the thickness of the heat-dissipating layer 4 is preferably 2 micrometers. When aluminum oxide is used as the heat-dissipating layer 4, it is prepared by an in vacuo film forming (ALD) process, and the thickness of the heat-dissipating layer 4 is preferably 2 micrometers.

With reference to FIG. 9, particularly in this embodiment, the Step S305 is a step of preparing a second encapsulating layer 32 on the heat-dissipating layer 4, by a chemical vapor deposition (CVD) process, an in vacuo film forming (ALD) process, or a sputtering (SPUTTER) process. More particularly, this embodiment comprises preparing the second encapsulating layer 32 (i.e., a layer of an oxide of silicon (SiOx)) with a thickness of preferably 1.5 micrometers on the heat-dissipating layer 4, by a chemical vapor deposition (CVD) process, an in vacuo film forming (ALD) process, or a sputtering (SPUTTER) process. Accordingly, surface encapsulating is particularly performed on the second encapsulating layer 32.

Figure 10:
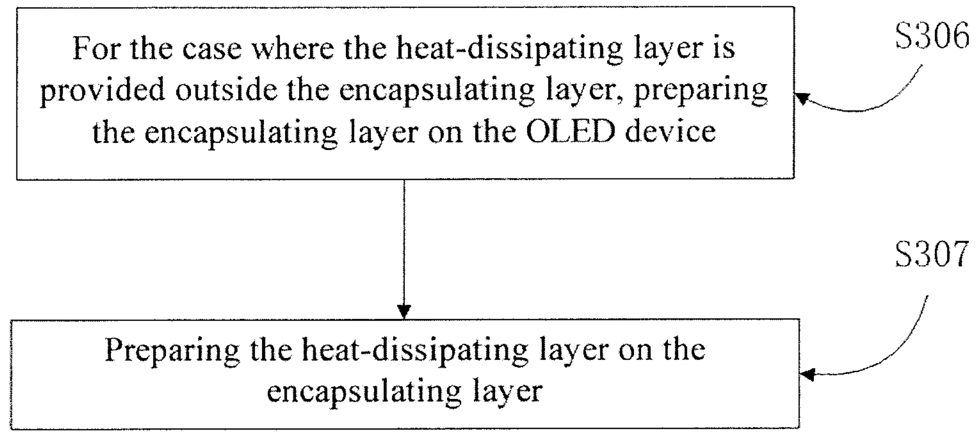
FIG. 10 is a flow chart of another producing method of an OLED substrate provided by an embodiment of this disclosure.
Figure 11:
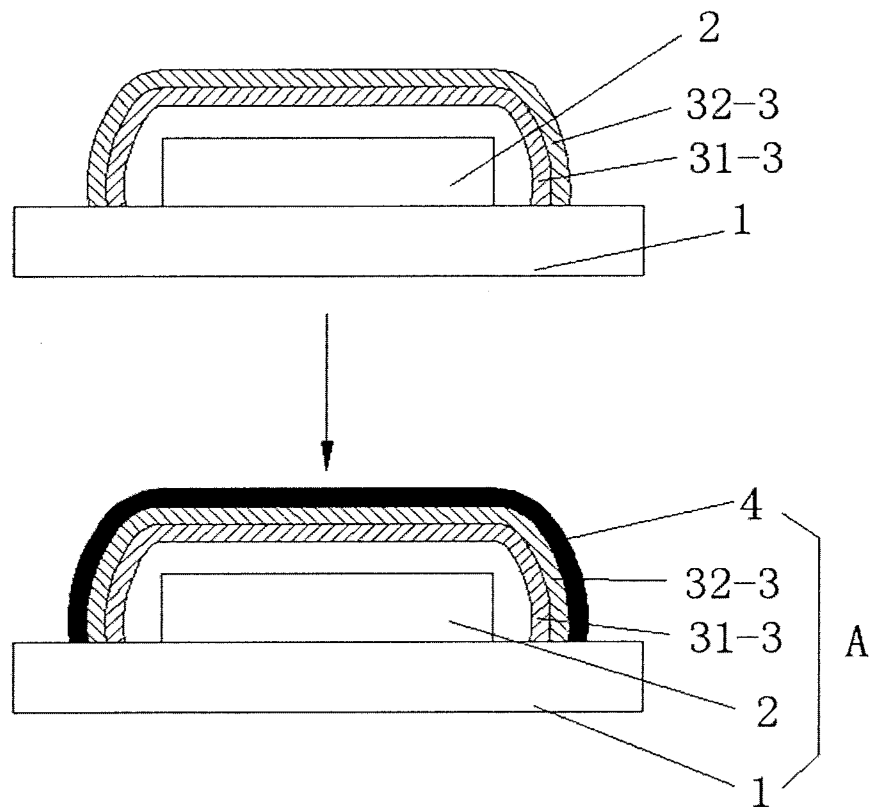
FIG. 11 is a structural diagram of another production process of an OLED substrate provided by an embodiment of this disclosure.

As shown in FIG. 10 and also with reference to FIG. 11 (this embodiment is illustrated by exemplifying FIG. 10), the heat-dissipating layer 4 (see FIG. 11) is provided outside the encapsulating layer 3 (see FIG. 11), and performing the preparation of an OLED substrate A (see FIG. 11) on the OLED device 2 (see FIG. 11), which corresponds to the Step S300 in FIG. 4, specifically comprises:

Step S306: preparing the encapsulating layer 3 (see FIG. 11) on the OLED device 2 (see FIG. 11); and Step S307: preparing the heat-dissipating layer 4 (see FIG. 11) on the encapsulating layer 3 (see FIG. 11).

This embodiment has a simple process and is easy to be processed.

With reference to FIG. 11, particularly in this embodiment, the Step S306 comprises preparing a first encapsulating layer 31 (i.e., a nitride of silicon (SiNx)) with a thickness of preferably 1.5 micrometers on the OLED device 2, in particular a cathode of the OLED device 2, by a chemical vapor deposition (CVD) process, an in vacuo film forming (ALD) process, or a sputtering (SPUTTER) process, and then preparing a second encapsulating layer 32 (i.e., a layer of an oxide of silicon (SiOx)) with a thickness of preferably 1.5 micrometers on the first encapsulating layer 31, by a chemical vapor deposition (CVD) process, an in vacuo film forming (ALD) process, or a sputtering (SPUTTER) process.

With reference to FIG. 11, particularly in this embodiment, the Step S307 is a step of preparing the heat-dissipating layer 4 on the second encapsulating layer 32, by a chemical vapor deposition (CVD) process, an in vacuo film forming (ALD) process, or a sputtering (SPUTTER) process. More particularly, when a nitride of aluminum is selected as the heat-dissipating layer 4, it is prepared by a chemical vapor deposition (CVD) process, and the thickness of the heat-dissipating layer 4 is preferably 2 micrometers. When aluminum oxide is used as the heat-dissipating layer 4, it is prepared by an in vacuo film forming (ALD) process, and the thickness of the heat-dissipating layer 4 is preferably 2 micrometers. Accordingly, surface encapsulating is performed on the heat-dissipating layer 4.

Embodiment 3

Figure 12:
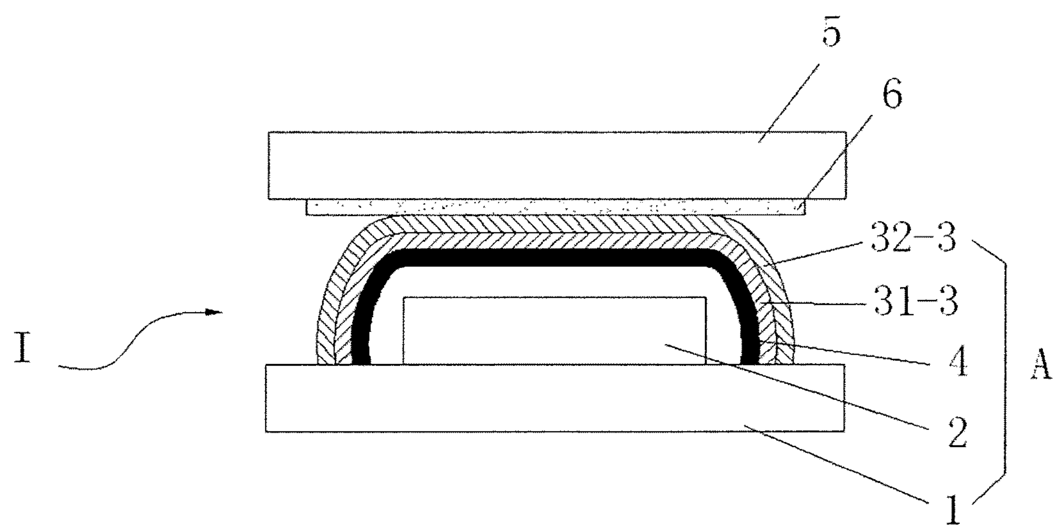
FIG. 12 is a structural diagram of one OLED panel provided by an embodiment of this disclosure.

As shown in FIG. 12, this embodiment provides an OLED panel I, comprising the OLED substrate A and a second substrate 5 oppositely mounted on the OLED substrate A.

Of course, the person skilled in the art may understand that the OLED substrate A may also be the OLED substrates A as shown in FIG. 2 to FIG. 3.

The structure of the OLED substrate A in this embodiment is completely the same as that of the OLED substrate A in embodiment 1, verbose words are omitted in this embodiment with respect to the part of the structure of the OLED substrate A.

Because the OLED panel I of this embodiment includes all contents of the OLED substrate A in embodiment 1, the display apparatus of this embodiment also includes all effects of the OLED substrate A. By adding the heat-dissipating layer 4 and by means of the good thermal conductivity of the heat-dissipating layer 4, it rapidly dissipates the heat generated when the OLED device 2 is lit, so as to prolong the service life of the OLED device 2, such that the service life of OLED panel I is prolonged.

More particularly, in this embodiment, the OLED substrate A and a second substrate 5 attached with an encapsulating sheet adhesive 6 are laminated and subjected to hot-press curing to achieve surface encapsulating, and the OLED panel I is finally formed. Here, the encapsulating sheet adhesive 6 is a double sided adhesive. Of course, the encapsulating sheet adhesive 6 may also be any type of sheet adhesives capable of achieving the effect of double sided adhesion.

More particularly, as shown in FIG. 12, in this embodiment, the second substrate 5 may be a glass substrate, and may also be a plastic substrate or other substrates.

More particularly, with reference to FIG. 12, the OLED panel I may be a display panel, or may also be a lighting panel.

Embodiment 4

With reference to FIG. 1, this embodiment provides a display apparatus, comprising the OLED substrate A.

Of course, the person skilled in the art may understand that the OLED substrate A may also be the OLED substrates A as shown in FIG. 2 to FIG. 3.

The structure of the OLED substrate A in this embodiment is completely the same as that of the OLED substrate A in embodiment 1, verbose words are omitted in this embodiment with respect to the part of the structure of the OLED substrate A.

With reference to FIG. 1, since the display apparatus of this embodiment includes all contents of the OLED substrate A in embodiment 1, the display apparatus of this embodiment also includes all effects of the OLED substrate A. In this embodiment, by adding the heat-dissipating layer 4 and forming a contact-type heat dissipation structure with the heat-dissipating layer 4 and the encapsulating layer 3, and by means of the good thermal conductivity of the heat-dissipating layer 4, it rapidly dissipates the heat generated when the OLED device 2 is lit, so as to prolong the service life of the OLED device 2, such that the service life of OLED panel and in turn the service life of display apparatuses are prolonged.

The display apparatus may be a cell phone, a navigator, a tablet computer, a television, a laptop, a monitor, etc.

The embodiments described above are for reference only and this disclosure is not limited thereto. The numbers of the above embodiments of this disclosure are only for the purpose of description and do not represent goodness and badness.

Those described above are merely preferred embodiments of this disclosure, and are not intended to limit this disclosure. All of modifications, equivalent replacements, improvements, and the like, which are within the spirit and the principle of this disclosure, should be encompassed in the scope of this disclosure.

What is claimed is:

1. An OLED substrate, comprising an OLED device and an encapsulating layer, which are located on a first substrate, wherein the encapsulating layer encapsulates the OLED device, and the encapsulating layer is a single layer or includes a plurality of encapsulating layers, wherein the OLED substrate further comprises a heat-dissipating layer above the OLED device, and wherein the heat-dissipating layer is provided between the OLED device and the encapsulating layer and fully covers the OLED device, or the heat-dissipating layer is provided between any two adjacent layers of the plurality of encapsulating layers and the innermost encapsulating layer close to the OLED device fully covers the OLED device.

2. The OLED substrate according to claim 1, wherein the heat-dissipating layer is provided between the OLED device and the encapsulating layer and is in contact with the OLED device.

3. The OLED substrate according to claim 2, wherein the heat-dissipating layer is an insulator heat-dissipating material or a semiconductor heat-dissipating material.

4. The OLED substrate according to claim 1, wherein the heat-dissipating layer is provided between the OLED device and the encapsulating layer and is not in contact with the OLED device.

5. The OLED substrate according to claim 4, wherein the heat-dissipating layer is an insulator heat-dissipating material, a semiconductor heat-dissipating material, or a metal material.

6. The OLED substrate according to claim 1, wherein the heat-dissipating layer is provided between any two adjacent layers of the plurality of encapsulating layers and is an insulator heat-dissipating material, a semiconductor heat-dissipating material, or a metal material.

7. The OLED substrate according to claim 6, wherein the insulator heat-dissipating material is one of a nitride of aluminum, boron nitride, polycrystalline boron nitride, or aluminum oxide.

8. The OLED substrate according to claim 6, wherein the semiconductor heat-dissipating material is one of graphene or carbon nanotube.

9. The OLED substrate according to claim 6, wherein the metal material is one of aluminum, magnesium, or copper.

10. The OLED substrate according to claim 1, wherein the heat-dissipating layer has a thickness of 100 μm or less.

11. The OLED substrate according to claim 10, wherein the heat-dissipating layer has a thickness of 1 μm-5 μm.

12. The OLED substrate according to claim 1, wherein the encapsulating layer is a thin-film encapsulating layer.

13. An OLED panel, comprising the OLED substrate according to claim 1 and a second substrate oppositely mounted on the OLED substrate.

14. A display apparatus, comprising the OLED substrate according to claim 1.

15. A producing method of an OLED substrate, comprising the steps of:

providing a first substrate;

preparing an OLED device on the first substrate; and performing the preparation of an OLED substrate on the OLED device, wherein the OLED substrate comprises a heat-dissipating layer and an encapsulating layer, and the heat-dissipating layer is provided above the OLED device, wherein, the encapsulating layer is a single layer or includes a plurality of encapsulating layers, the heat-dissipating layer is provided between the OLED device and the encapsulating layer and fully covers the OLED device, or the heat-dissipating layer is provided between any two adjacent layers of the plurality of encapsulating layers and the innermost encapsulating layer close to the OLED device fully covers the OLED device.

16. The producing method according to claim 15, wherein the heat-dissipating layer is provided between the OLED device and the encapsulating layer, and said performing the preparation of an OLED substrate on the OLED device specifically comprises:

preparing the heat-dissipating layer on the OLED device; and preparing the encapsulating layer on the heat-dissipating layer, or wherein the encapsulating layer includes a plurality of encapsulating layers, the heat-dissipating layer is provided between two adjacent encapsulating layers, and said performing the preparation of an OLED substrate on the OLED device specifically comprises:

preparing an encapsulating layer on the OLED device;

preparing the heat-dissipating layer on the encapsulating layer; and further preparing an encapsulating layer on the heat-dissipating layer.

* * * * *